(12) United States Patent
Kim

(10) Patent No.: US 8,063,708 B2
(45) Date of Patent: Nov. 22, 2011

(54) PHASE LOCKED LOOP AND METHOD FOR OPERATING THE SAME

(75) Inventor: Kwan-Dong Kim, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 90 days.

(21) Appl. No.: 11/967,839

(22) Filed: Dec. 31, 2007

(65) Prior Publication Data

US 2008/0284527 A1 Nov. 20, 2008

(30) Foreign Application Priority Data

May 16, 2007 (KR) .................. 10-2007-0047498
May 18, 2007 (KR) .................. 10-2007-0048574

(51) Int. Cl.
*H03L 7/10* (2006.01)

(52) U.S. Cl. .............. 331/17; 331/14; 327/157
(58) Field of Classification Search ........... 331/14, 331/17; 327/157
See application file for complete search history.

(56) References Cited

U.S. PATENT DOCUMENTS

| | | | | |
|---|---|---|---|---|
| 5,355,098 A | * | 10/1994 | Iwasaki | 331/14 |
| 5,656,975 A | * | 8/1997 | Imura | 331/11 |
| 5,874,863 A | * | 2/1999 | Wojewoda et al. | 331/17 |
| 6,029,250 A | | 2/2000 | Keeth | |
| 6,407,600 B1 | | 6/2002 | Lu et al. | |
| 6,912,680 B1 | | 6/2005 | Keeth | |
| 7,283,003 B2 | * | 10/2007 | Jeon | 331/16 |
| 2004/0251970 A1 | | 12/2004 | Fayneh et al. | |
| 2006/0066759 A1 | | 3/2006 | Ikuma et al. | |

FOREIGN PATENT DOCUMENTS

| | | |
|---|---|---|
| JP | 04-107011 | 8/1992 |
| KR | 1998-065790 | 10/1998 |
| KR | 1999-0079320 | 11/1999 |
| KR | 20030027866 | 4/2003 |
| KR | 2004-37915 | 5/2004 |

* cited by examiner

*Primary Examiner* — Robert Pascal
*Assistant Examiner* — James Goodley
(74) *Attorney, Agent, or Firm* — Blakely, Sokoloff, Taylor & Zafman

(57) ABSTRACT

A phase locked loop can reduce a locking time, thereby efficiently reducing power in a locking operation. The phase locked loop includes a phase detector, a control voltage generator, a voltage controlled oscillator and a start-up driver. The phase detector detects a phase difference between a reference clock and a feedback clock to generate a detection signal corresponding to the detected phase difference. The control voltage generator generates a control voltage having a voltage level corresponding to the detection signal. The voltage controlled oscillator generates an internal clock having a frequency corresponding to a voltage level of the control voltage. The start-up driver drives a control voltage terminal to a predefined start-up level in response to a start-up level multiplex signal corresponding to a frequency of the reference clock prior to activation of the voltage controlled oscillator.

23 Claims, 5 Drawing Sheets

PHASE LOCKED LOOP AND METHOD FOR OPERATING THE SAME

CROSS-REFERENCE TO RELATED APPLICATIONS

The present invention claims priority to Korean patent application numbers 10-2007-0047498 and 10-2007-0048574, filed on May 16, 2007 and May 18, 2007 respectively, which are incorporated by reference in its entirety.

BACKGROUND OF THE INVENTION

The present invention relates to a semiconductor device, and more particularly to a phase locked loop (PLL), which can ensure a fast locking time, and a method for operating the same.

In semiconductor devices such as double data rate (DDR) synchronous dynamic random access memory (SDRAM), an external clock is used as a reference to match operation timings. However, a clock skew may occur in the external clock due to the delay in clock/data path of internal circuits. In order to compensate the clock skew, a clock synchronization circuit is provided within the semiconductor device. Examples of the clock synchronization circuit include a phase locked loop (PLL) and a delay locked loop (DLL). The semiconductor device transmits/receives signals to/from external devices by using an internal clock outputted from the clock synchronization circuit.

The PLL having a frequency multiplication function is mainly used when the frequency of the external clock is different from the frequency of the internal clock, and the DLL is mainly used when the frequency of the external clock is equal to the frequency of the internal clock. The configuration of the PLL is basically similar to that of the DLL. The PLL uses a voltage controlled oscillator (VCO) to generate the internal clock, while the DLL uses a voltage controlled delay line (VCDL).

Compared with the DLL, the PLL occupies a large chip area and is difficult to design, but it can generate various clocks through frequency synthesis and can easily achieve a clock data recovery (CDR). Therefore, the PLL is used in a variety of applications, e.g., communications, wireless systems, digital circuits, etc. As the operating speed of the chip is increasing, the PLL is essential to designing high-speed semiconductor devices with high operating frequency. It is expected that the application fields of the PLL will be widely expanded with rapid development of semiconductor device design technology.

FIG. 1 is a block diagram of a conventional PLL.

Referring to FIG. 1, the PLL includes a phase detector 110, a control voltage generator 130, a voltage control oscillator (VCO) 150. The phase detector 110 detects a phase difference between a reference clock CLK_REF and a feedback clock CLK_FED to generate detection signals DET_UP and DET_DN corresponding to the detected phase difference. The control voltage generator 130 receives the detection signals DET_UP and DET_DN to generate a control voltage V_CTR having a voltage level corresponding to the detection signals DET_UP and DET_DN. The VCO 150 generates an internal clock CLK_INN having a frequency corresponding to the control voltage V_CTR. A frequency divider 170 may be further included which divides the frequency of the internal clock CLK_INN to generate the feedback clock CLK_FED.

The phase detector 110 generates the up detection signal DET_UP and the down detection signal DET_DN according to the phase difference between the reference clock CLK_REF and the feedback clock CLK_FED. The up detection signal DET_UP is a pulse signal enabled when the phase of the feedback signal CLK_FED lags behind the phase of the reference clock CLK_REF, and it has a pulse width corresponding to the phase difference between the feedback signal CLK_FED and the reference clock CLK_REF. The down detection signal DET_DN is a pulse signal enabled when the phase of the feedback signal CLK_FED leads the phase of the reference clock CLK_REF, and it has a pulse width corresponding to the phase difference between the feedback signal CLK_FED and the reference clock CLK_REF.

The control voltage generator 130 includes a charge pump 132 and a loop filter 134. The charge pump 132 controls a current to be supplied to the loop filter 134 according to the pulse width of the up detection signal DET_UP and the down detection signal DET_DN. The loop filter 134 generates the control voltage V_CTR by charging or discharging the supplied current.

The VCO 150 generates an internal clock CLK_INN having a frequency corresponding to a voltage level of the control voltage V_CTR. For example, as the voltage level of the control voltage V_CTR becomes higher, the frequency of the internal clock CLK_INN becomes higher. As the voltage level of the control voltage V_CTR becomes lower, the frequency of the internal clock CLK_INN becomes lower.

The frequency divider 170 generates the feedback clock CLK_FED having a frequency lower than the internal clock CLK_INN in order to use a crystal oscillator as a reference frequency source. The crystal oscillator can maintain the reference clock CLK_REF at the correct frequency even in a change of surroundings. The phase detector 110 compares the feedback clock CLK_FED of a low frequency with the reference clock CLK_REF of a low frequency.

The PLL generates the internal clock CLK_INN having a desired frequency by repeating the locking operation until the frequency of the reference clock CLK_REF is equal to that of the feedback clock CLK_FED. The term "locking" means that the internal clock CLK_INN has a desired target frequency.

FIG. 2 is a block diagram of the phase detector 110 illustrated in FIG. 1.

Referring to FIG. 2, the phase detector 110 includes a first D flip-flop 112, a second D flip-flop 114, and a logic gate AND1. The first D flip-flop 112 is configured to generate the up detection signal DET_UP in response to the reference clock CLK_REF. The second D flip-flop 114 is configured to generate the down detection signal DET_DN in response to the feedback clock CLK_FED. The logic gate AND1 is configured to receive the up detection signal DET_UP and the down detection signal DET_DN to generate a reset signal CTR_RST resetting the first and second D flip-flops 112 and 114.

The phase detector 110 generates the up detection signal DET_UP of a logic high level when the reference clock CLK_REF is at a high level, and generates the down detection signal DET_DN of a logic high level when the feedback clock CLK_FED is at a logic high level. The phase detector 110 activates the reset signal CTR_RST to reset the first and second D flip-flops 112 and 14 when the reference clock CLK_REF and the feedback clock CLK_FED are all at a logic high level.

Consequently, when the phase of the reference clock CLK_REF leads that of the feedback clock CLK_FED, the phase detector 110 generates the up detection signal DET_UP having a pulse width corresponding to the phase difference between the reference clock CLK_REF and the feedback clock CLK_FED. When the phase of the feedback clock CLK_FED leads that of the reference clock CLK_REF, the phase detector 110 generates the down detection signal DET_DN having a pulse width corresponding to the phase difference between the reference clock CLK_REF and the feedback clock CLK_FED.

Since the circuit configurations of the first and second D flip-flops 112 and 114 are well known, their detailed description is omitted for conciseness.

FIG. 3 is a circuit diagram of the VCO 150 illustrated in FIG. 1.

Referring to FIG. 3, the VCO 150 includes a plurality of PMOS transistors 152, a plurality of NMOS transistors 154, and a plurality of inverters 156. Each of the inverters has unit delay time according to a voltage level of the control voltage V_CTR. When the voltage level of the control voltage V_CTR increases, a large amount of current is supplied to the inverters of the VCO 150. Therefore, the delay time of each of the inverters becomes short and the VCO 150 generates the internal clock CLK_INN of a high frequency. On the other hand, when the voltage level of the control voltage V_CTR decreases, a small amount of current is supplied to the inverters. Therefore, the delay time of each of the inverters becomes long and the VCO 150 generates the internal clock CLK_INN of a low frequency.

The control voltage (V_CTR) terminal of the VCO 150 will be described below.

In the VCO 150, the voltage level of the control voltage V_CTR is made to a logic low level before the locking operation. This prevents undesired current consumption caused by unnecessary operations of the VCO 150 before the PLL operates.

In other words, since the control voltage V_CTR is inputted to gates of the plurality of NMOS transistors 154, the control voltage V_CTR is made to a logic low level before the PLL operates. If the control voltage V_CTR is inputted to the plurality of PMOS transistors 152, the control voltage V_CTR is made to a logic high level before the PLL operates.

The PLL of FIG. 3 performs the locking operation to increase the control voltage V_CTR of a logic low level up to a voltage level at which the internal clock CLK_INN of a desired target frequency can be generated. The time necessary to generate the control voltage V_CTR for generating the internal clock CLK_INN of the desired target frequency is defined as a locking time.

To meet the requirements of high-speed operation of semiconductor devices, it is necessary to rapidly generate the internal clock CLK_INN of a desired frequency at a fast speed by reducing the locking time. Thus, there is a need for techniques that can reduce the locking time.

SUMMARY OF THE INVENTION

Embodiments of the present invention are directed to providing a PLL, which can reduce a locking time, and a method for operating the same.

Embodiments of the present invention are also directed to providing a PLL, which can efficiently reduce power in a locking operation, and a method for operating the same.

The locking time of the PLL can be reduced by driving a control voltage terminal to a start-up level before operation of the PLL. The start-up level may have a voltage level of the control voltage given at a locking time point of the PLL.

In accordance with an aspect of the present invention, there is provided a phase locked loop including a phase detector configured to detect a phase difference between a reference clock and a feedback clock to generate a detection signal corresponding to the detected phase difference, a control voltage generator configured to generate a control voltage having a voltage level corresponding to the detection signal, a voltage controlled oscillator configured to generate an internal clock having a frequency corresponding to a voltage level of the control voltage, and a start-up driver configured to drive a control voltage terminal to a predefined start-up level in response to a start-up level multiplex signal corresponding to a frequency of the reference clock prior to activation of the voltage controlled oscillator.

In accordance with another aspect of the present invention, there is provided a method for operating a phase locked loop having a voltage controlled oscillator for generating an internal clock having a frequency corresponding to a voltage level of a control voltage, which includes driving the control voltage terminal to a predefined start-up level in response to a start-up signal prior to activation of the voltage controlled oscillator, and performing a locking operation of the phase locked loop.

In accordance with a further aspect of the present invention, there is provided an integrated circuit including a phase locked loop including a voltage controlled oscillator, and a start-up driver configured to drive a control voltage terminal to a voltage level corresponding to a target frequency prior to activation of the voltage controlled oscillator.

DESCRIPTION OF SPECIFIC EMBODIMENTS

Hereinafter, a PLL and a method for operating the same in accordance with the present invention will be described in detail with reference to the accompanying drawings.

Figure 1:
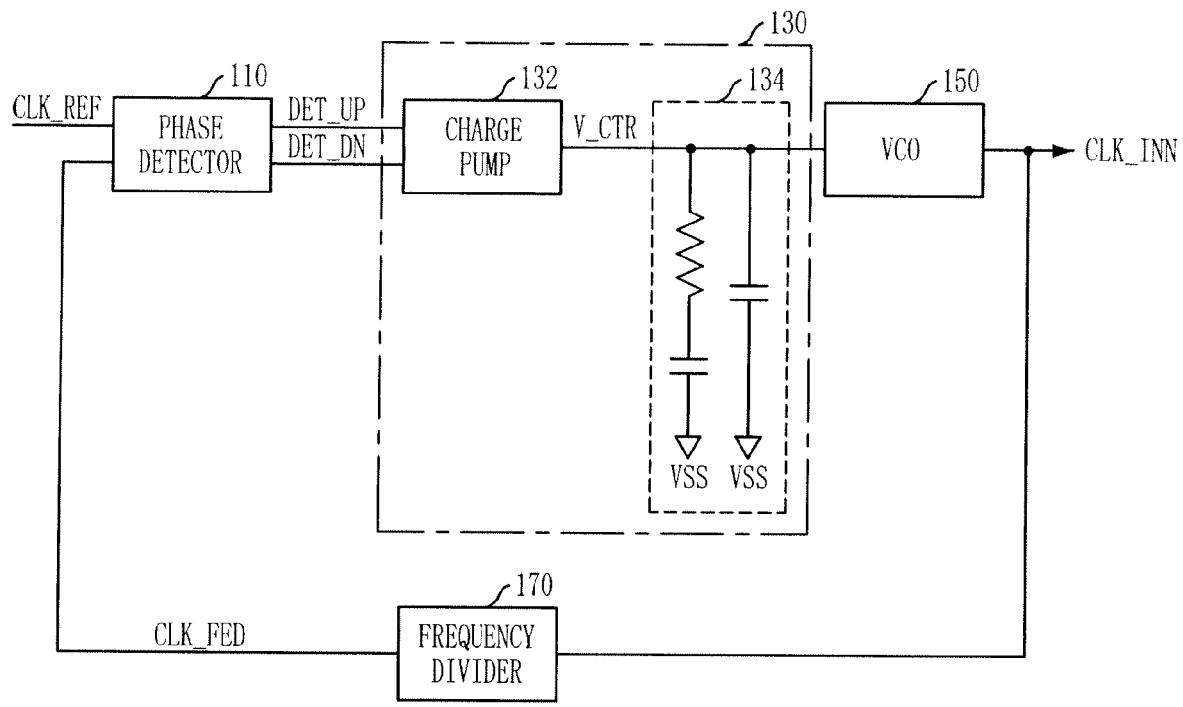
FIG. 1 is a block diagram of a typical PLL.
Figure 2:
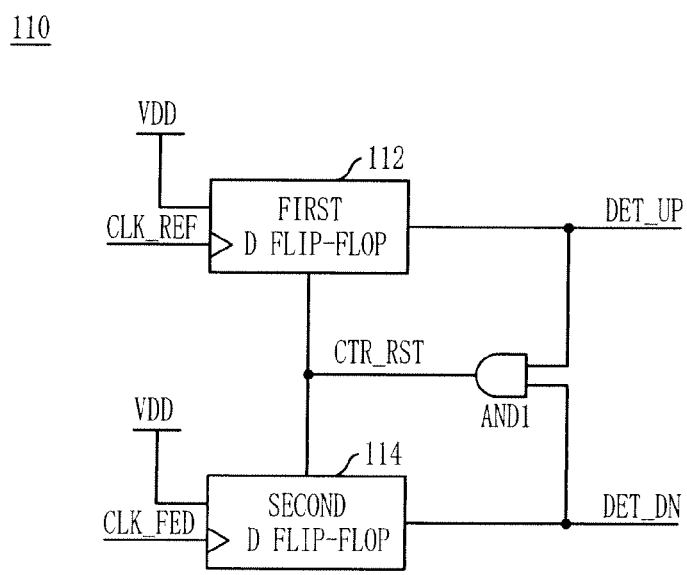
FIG. 2 is a block diagram of a phase detector illustrated in FIG. 1.
Figure 3:
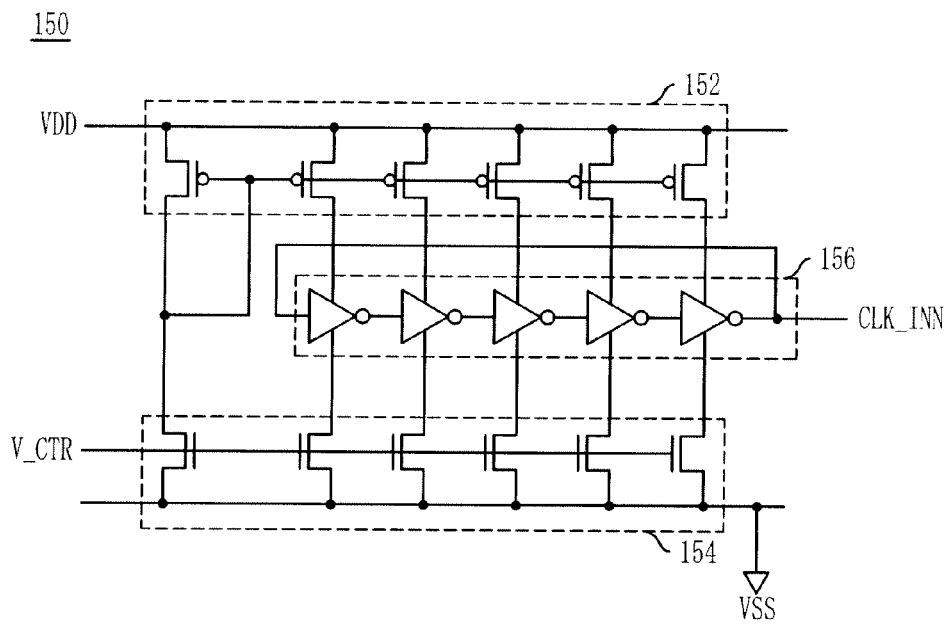
FIG. 3 is a circuit diagram of a VCO illustrated in FIG. 1.
Figure 4:
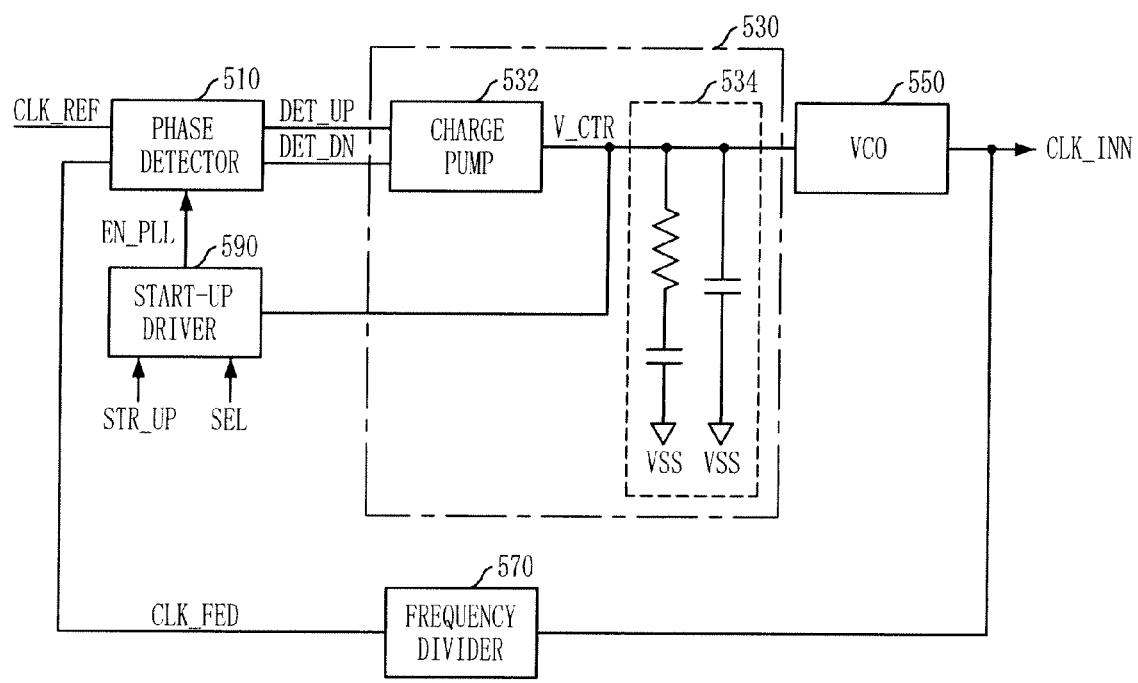
FIG. 4 is a block diagram of a PLL in accordance with an embodiment of the present invention.

FIG. 4 is a block diagram of a PLL in accordance with an embodiment of the present invention.

Referring to FIG. 4, the PLL includes a phase detector 510, a control voltage generator 530, a VCO 550, and a start-up driver 590. The phase detector 510 is enabled in response to a PLL enable signal EN_PLL and detects a frequency difference between a reference clock CLK_REF and a feedback clock CLK_FED to generate detection signals DET_UP and DET_DN corresponding to the detected frequency difference. The control voltage generator 530 receives the detection signals DET_UP and DET_DN to generate a control voltage V_CTR having a voltage level corresponding to the detection signals DET_UP and DET_DN. The VCO 550 generates an internal clock CLK_INN having a frequency corresponding to the control voltage V_CTR. The start-up driver 590 drives the control voltage (V_CTR) terminal to a predefined start-up level prior to the activation of the VCO 550 in response to a start-up level multiplex signal SEL corresponding to the frequency of the reference clock CLK_REF. The PLL may further include a frequency divider 570 that divides the frequency of the internal clock CLK_INN to generate the feedback clock CLK_FED.

The phase detector 510 generates the up detection signal DET_UP and the down detection signal DET_DN according to the phase difference between the reference clock CLK_REF and the feedback clock CLK_FED in response to the PLL enable signal EN_PLL. The up detection signal DET_UP is a pulse signal enabled when the phase of the feedback signal CLK_FED lags behind the phase of the reference clock CLK_REF, and it has a pulse width corresponding to the phase difference between the feedback signal CLK_FED and the reference clock CLK_REF. The down detection signal DET_DN is a pulse signal enabled when the phase of the feedback signal CLK_FED leads the phase of the reference clock CLK_REF, and it has a pulse width corresponding to the phase difference between the feedback signal CLK_FED and the reference clock CLK_REF.

The control voltage generator 530 includes a charge pump 532 and a loop filter 534. The charge pump 532 generates a current corresponding to a pulse width of the up detection signal DET_UP and the down detection signal DET_DN, and the loop filter 534 generates the control voltage V_CTR by charging or discharging the supplied current.

The VCO 550 generates an internal clock CLK_INN having a frequency corresponding to a voltage level of the control voltage V_CTR. For example, as the voltage level of the control voltage V_CTR becomes higher, the frequency of the internal clock CLK_INN becomes higher. As the voltage level of the control voltage V_CTR becomes lower, the frequency of the internal clock CLK_INN becomes lower.

The frequency divider 570 generates the feedback clock CLK_FED having a frequency lower than the internal clock CLK_INN in order to use a crystal oscillator as a reference frequency source. The crystal oscillator can maintain the reference clock CLK_REF at the correct frequency even in a change of surroundings. The phase detector 510 compares the feedback clock CLK_FED of a low frequency with the reference clock CLK_REF of a low frequency.

The use of the start-up driver 590 can reduce the locking time.

The start-up driver 590 drives the control voltage (V_CTR) terminal to a predefined start-up level corresponding to a target frequency in response to a start-up signal STR_UP prior to the operation of the PLL, more specifically the activation of the VCO 550.

Preferably, the start-up level has a voltage level of the control voltage V_CTR given at the locking time point and may change according to the reference clock CLK_REF. The start-up level is selected by the start-up level multiplex signal SEL, and the start-up level multiplex signal SEL may be outputted through a mode register set (MRS) or a fuse option circuit. Therefore, the start-up level multiplex signal SEL must have information on the reference clock CLK_REF. That is, it is preferable that the start-up level multiplex signal SEL has information on the desired start-up level.

In other words, the start-up driver 590 can implement the fast locking operation by providing the start-up level corresponding to the start-up level multiplex signal SEL to the control voltage (V_CTR) terminal before the operation of the PLL.

Figure 5:
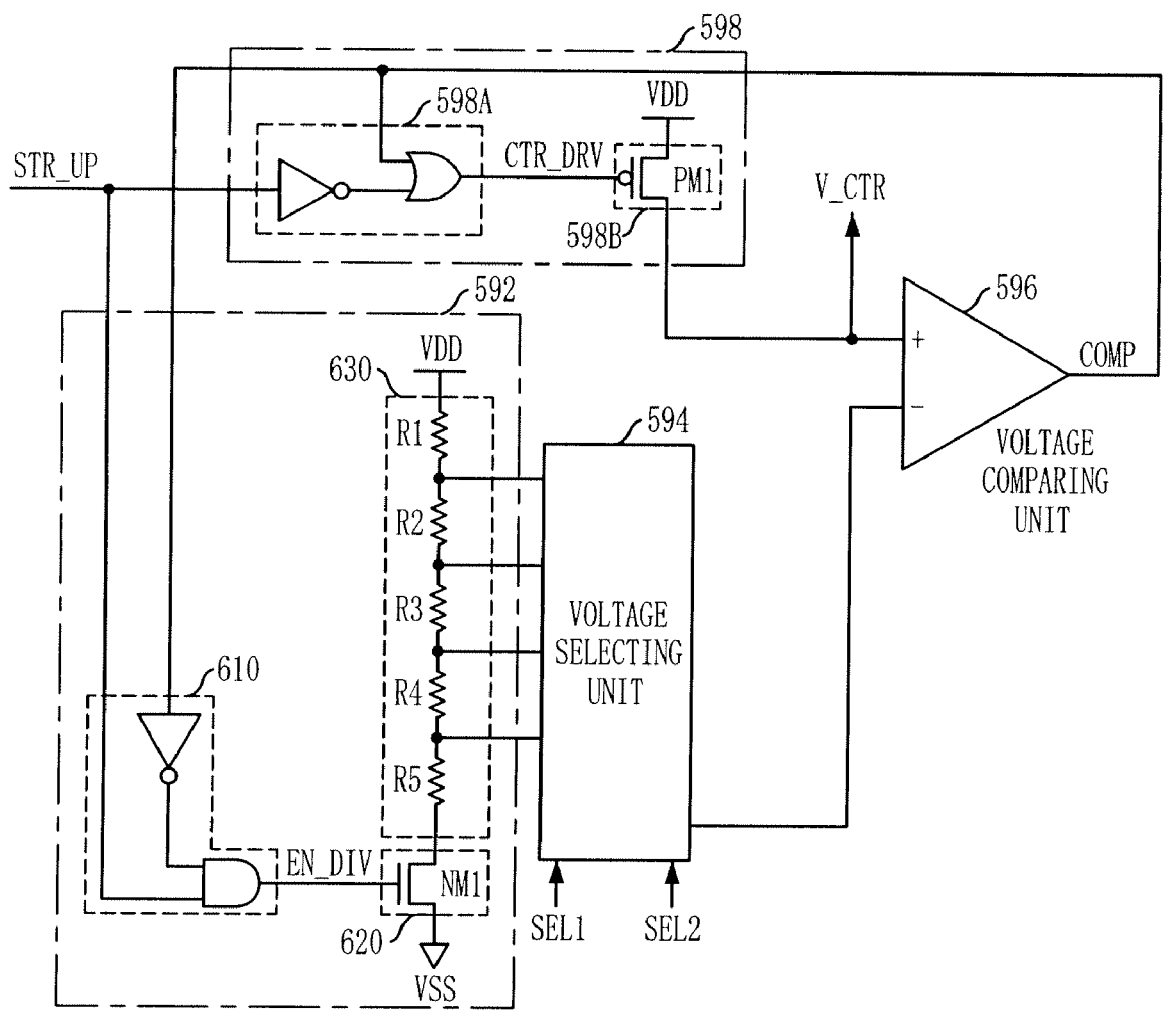
FIG. 5 is a circuit diagram of a start-up driver illustrated in FIG. 4.

FIG. 5 is a circuit diagram of the start-up driver 590 illustrated in FIG. 4.

Referring to FIG. 5, the start-up driver 590 includes a voltage generating unit 592, a voltage selecting unit 594, a voltage comparing unit 596, and a driving unit 598. The voltage generating unit 592 divides an external voltage VDD to generate a plurality of divided voltages. The voltage selecting unit 594 selects one of the plurality of divided voltages in response to the start-up level multiplex signals SEL1 and SEL2. The voltage comparing unit 596 compares the voltage level of the control voltage (V_CTR) terminal with the voltage level of the selected divided voltage to generate a comparison signal COMP. The driving unit 598 drives the control voltage (V_CTR) terminal in response to the start-up signal STR_UP and the comparison signal COMP.

The voltage generating unit 592 includes an enable signal generating unit 610, an enabling unit 620, and a voltage dividing unit 630. The enable signal generating unit 610 receives the start-up signal STR_UP and the comparison signal COMP to generate the enable signal EN_DIV. The enabling unit 620 enables the voltage dividing unit 630 in response to the enable signal EN_DIV. The voltage dividing unit 630 is connected between an external voltage (VDD) terminal and the enabling unit 620 to divide the external voltage VDD.

The enabling unit 620 may include a first NMOS transistor NM1 having a drain connected to the voltage dividing unit 630, a source connected to a ground voltage (VSS) terminal, and a gate receiving the enable signal EN_DIV. The enable signal EN_DIV is activated in response to the start-up signal STR_UP and deactivated in response to the comparison signal COMP.

The voltage dividing unit 630 may include a plurality of resistors R1, R2, R3, R4 and R5 serially connected between the external voltage (VDD) terminal and the enabling unit 620. In this embodiment, the voltage dividing unit 630 is configured with five resistors and generates four divided voltages. To reduce the chip area and generate a variety of divided voltages, the voltage dividing unit 630 may be implemented in various manners using elements other than resistors occupying a relatively large area. This will be described later in detail with reference to the accompanying drawings.

The driving unit 598 includes a driving control signal generating unit 598A and a pull-up driving unit 598B. The driving control signal generating unit 598A receives the start-up signal STR_UP and the comparison signal COMP to generate a driving control signal CTR_DRV. The pull-up driving unit 598B pulls up the control voltage (V_CTR) terminal in response to the driving control signal CTR_DRV.

The pull-up driving unit 598B may include a first PMOS transistor PM1 having a source connected to the external voltage (VDD) terminal, a drain connected to the control voltage (V_CTR) terminal, and a gate receiving the driving control signal CTR_DRV. The driving control signal CTR_DRV is activated in response to the start-up signal STR_UP and deactivated in response to the comparison signal COMP.

When the voltage level of the control voltage V_CTR is higher than that of the selected divided voltage, the comparison signal COMP becomes a logic high level and thus the voltage generating unit 592 and the driving unit 598 are disabled. When the voltage level of the selected divided voltage is higher than that of the control voltage V_CTR, the comparison signal COMP becomes a logic low level and thus the voltage generating unit 592 and the driving unit 598 are enabled.

The start-up level multiplex signals SEL1 and SEL2 are signals corresponding to the plurality of divided voltages. In this embodiment, two start-up level multiplex signals SEL1 and SEL2 are used to select four divided voltages.

The respective signals and nodes will be described in more detail.

When the comparison signal COMP is in a deactivated state of a logic low level and the start-up signal STR_UP becomes a logic high level prior to the activation of the VCO 550, the enable signal EN_DIV becomes a logic high level and the first NMOS transistor NM1 of the enabling unit 620 is turned on. Thus, the voltage dividing unit 630 generates the plurality of divided voltages, and the voltage selecting unit 594 selects one of the divided voltages in response to the start-up level multiplex signals SEL1 and SEL2.

It is preferable that the selected divided voltage corresponds to the predefined start-up level. The control voltage (V_CTR) terminal driven in response to the selected divided voltage can make it possible for the PLL to ensure a fast locking time.

Meanwhile, because a voltage level of the control voltage (V_CTR) terminal is lower than the selected divided voltage, the voltage comparing unit 596 outputs the comparison signal COMP of a logic low level continuously. The driving control signal CTR_DRV becomes a logic low level in response to the start-up signal STR_UP and the comparison signal COMP. Therefore, the first PMOS transistor PM1 of the pull-up driving unit 598B is turned on, so that the control voltage (V_CTR) terminal is rapidly pulled up. When the voltage level of the control voltage (V_CTR) terminal increases to be higher than that of the selected divided voltage V_CTR, the voltage comparing unit 596 outputs the comparison signal COMP at a logic high level. The comparison signal COMP at the logic high level disables the voltage generating unit 592 and the driving unit 598 and thus the start-up operation of the start-up driver 590 is stopped.

Figure 6:
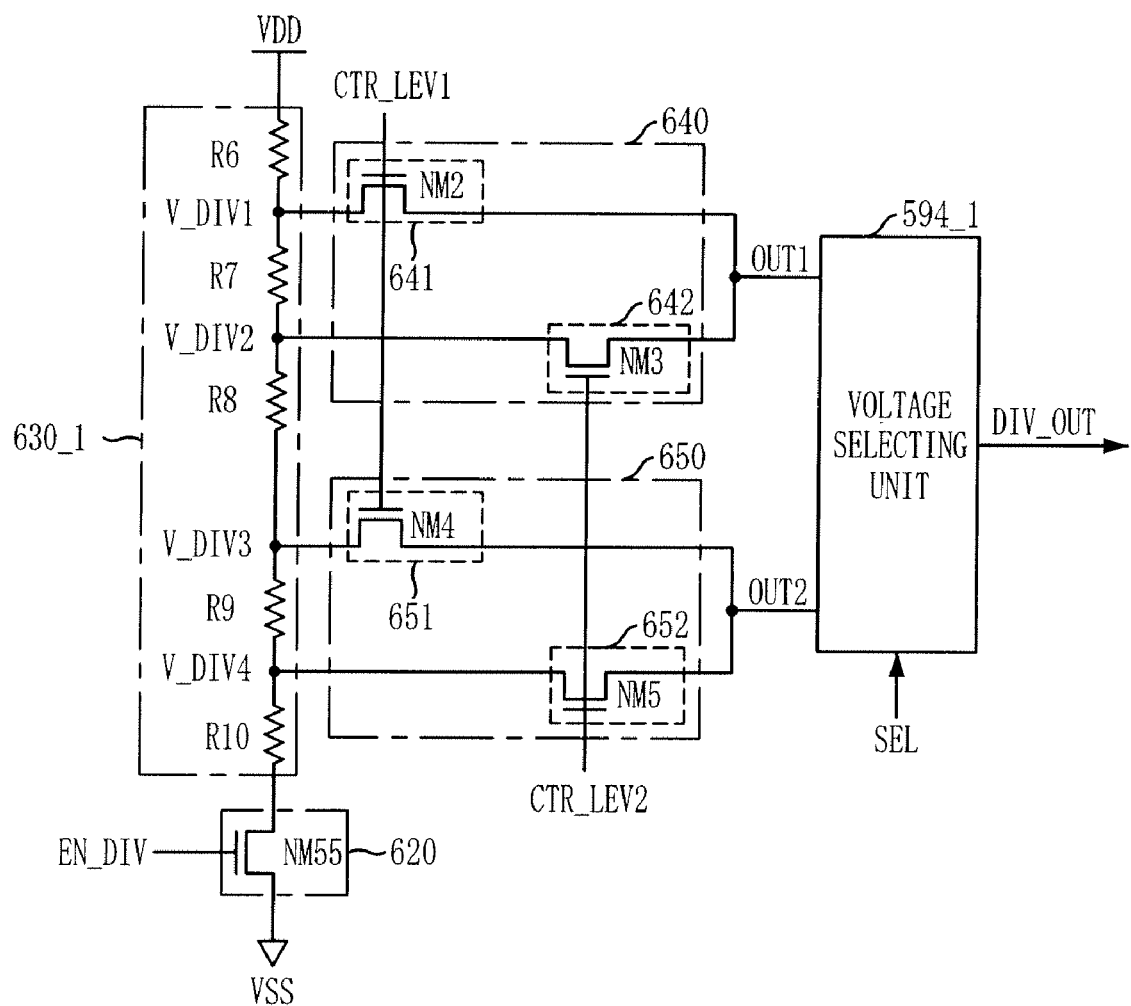
FIG. 6 is a circuit diagram of a voltage dividing unit and a voltage selecting unit in accordance with another embodiment of the present invention.

FIG. 6 is a circuit diagram of a voltage dividing unit and a voltage selecting unit in accordance with another embodiment of the present invention.

Referring to FIG. 6, the voltage dividing unit includes a voltage divider 630_1, a first level multiplexer 640, a second level multiplexer 650, and a voltage selector 594_1. The voltage divider 630_1 divides the external voltage VDD to generate a plurality of divided voltages V_DIV1, V_DIV2, V_DIV3, V_DIV4 and V_DIV5. The first level multiplexer 640 outputs one of the first divided voltage V_DIV1, the second divided voltage V_DIV2, and a voltage having a mid level of the first and second divided voltages V_DIV1 and V_DIV2 in response to control signals CTR_LEV1 and CTR_LEV2. The second level multiplexer 650 outputs one of the third divided voltage V_DIV3, the fourth divided voltage V_DIV4, and a voltage having a mid level of the third and fourth divided voltages V_DIV3 and V_DIV4 in response to the control signals CTR_LEV1 and CTR_LEV2. The voltage selector 594_1 selects one of the output signals of the first and second level multiplexers 640 and 650 in response to a start-up level multiplex signal SEL.

The voltage divider 630_1 includes five resistors R6, R7, R8, R9 and R10 serially connected between the external voltage (VDD) terminal and the ground voltage (VSS) terminal to generate the first to fourth divided voltages V_DIV1, V_DIV2, V_DIV3 and V_DIV4.

The first level multiplexer 640 includes a first switching unit 641 configured to connect a first divided voltage (V_DIV1) terminal to a first output terminal OUT1 in response to the first control signal CTR_LEV1, and a second switching unit 642 configured to connect a second divided voltage (V_DIV2) terminal to the first output terminal OUT1 in response to the second control signal CTR_LEV2.

The first switching unit 641 may include a first NMOS transistor NM2 having a drain connected to the first divided voltage (V_DIV1) terminal, a source connected to the first output terminal OUT1, and a gate receiving the first control signal CTR_LEV1. The second switching unit 642 may include a second NMOS transistor NM3 having a drain connected to the second divided voltage (V_DIV2) terminal, a source connected to the first output terminal OUT1, and a gate receiving the second control signal CTR_LEV2.

The second level multiplexer 650 includes a third switching unit 651 configured to connect a third divided voltage (V_DIV3) terminal to a second output terminal OUT2 in response to the first control signal CTR_LEV1, and a fourth switching unit 652 configured to connect a fourth divided voltage (V_DIV4) terminal to the second output terminal OUT2 in response to the second control signal CTR_LEV2.

The third switching unit 651 may include a third NMOS transistor NM4 having a drain connected to the third divided voltage (V_DIV3) terminal, a source connected to the second output terminal OUT2, and a gate receiving the first control signal CTR_LEV1. The fourth switching unit 652 may include a fourth NMOS transistor NM5 having a drain connected to the fourth divided voltage (V_DIV4) terminal, a source connected to the second output terminal OUT2, and a gate receiving the second control signal CTR_LEV2.

The number of the first and second control signals CTR_LEV1 and CTR_LEV2 and the start-up level multiplex signal SEL corresponds to the number of the divided voltages and the output terminals OUT1 and OUT2. The first and second control signals CTR_LEV1 and CTR_LEV2 may be generated from a mode register set (not shown) or may be inputted from an external or internal circuit.

Upon operation of the PLL, the voltage divider 630_1 generates the first to fourth divided voltages V_DIV1, V_DIV2, V_DIV3 and V_DIV4.

In a first case where the first control signal CTR_LEV1 has a logic high level and the second control signal CTR_LEV2 has a logic low level, the first and third NMOS transistors NM2 and NM4 are turned on and the second and fourth NMOS transistors NM3 and NM5 are turned off. Thus, the first divided voltage V_DIV1 is outputted through the first output terminal OUT1, and the third divided voltage V_DIV3 is outputted through the second output terminal OUT2. Consequently, the first divided voltage V_DIV1 or the third divided voltage V_DIV3 can be outputted through a final output terminal DIV_OUT according to the start-up level multiplex signal SEL.

In a second case where the first control signal CTR_LEV1 has a logic low level and the second control signal CTR_LEV2 has a logic high level, the first and third NMOS transistors NM2 and NM4 are turned off and the second and fourth NMOS transistors NM3 and NM5 are turned on. Thus, the second divided voltage V_DIV2 is outputted through the first output terminal OUT1, and the fourth divided voltage V_DIV4 is outputted through the second output terminal OUT2. Consequently, the second divided voltage V_DIV2 or the fourth divided voltage V_DIV4 can be outputted through the final output terminal DIV_OUT according to the start-up level multiplex signal SEL.

In a third case where the first control signal CTR_LEV1 has a logic high level and the second control signal CTR_LEV2 has a logic high level, the first and second NMOS transistors NM2 and NM3 are turned on, so that the voltage having the mid level of the first and second divided voltages V_DIV1 and V_DIV2 is outputted through the first output terminal OUT1. The third and fourth NMOS transistors NM4 and NM5 are turned on, so that the voltage having the mid level of the third and fourth divided voltages V_DIV3 and the V_DIV4 is outputted through the second output terminal OUT2. Likewise, the voltage level of the first output terminal OUT1 or the second output terminal OUT2 can be outputted through the final output terminal DIV_OUT according to the start-up level multiplex signal SEL.

As one example, it is assumed that the voltage divider 630_1 divides the external voltage VDD of 5 V to generate the first divided voltage V_DIV1 of 4 V, the second divided voltage V_DIV2 of 3 V, the third divided voltage V_DIV3 of 2 V, and the fourth divided voltage V_DIV4 of 1 V.

When the first control signal CTR_LEV1 is at a logic high level and the second control signal CTR_LEV2 is at a logic low level, the first divided voltage V_DIV1 of 4 V or the third divided voltage V_DIV3 of 2 V can be outputted through the final output terminal DIV_OUT. When the first control signal CTR_LEV1 is at a logic low level and the second control signal CTR_LEV2 is at a logic high level, the second divided voltage V_DIV2 of 3 V or the fourth divided voltage V_DIV4 of 1 V can be outputted through the final output terminal DIV_OUT. When the first control signal CTR_LEV1 and the second control signal CTR_LEV2 are all at a logic high level, the mid level 3.5 V of the first and second divided voltages V_DIV1 and V_DIV2 or a mid level 1.5V of the third and fourth divided voltages V_DIV3 and V_DIV4 can be outputted through the final output terminal DIV_OUT.

Therefore, compared with the voltage selecting unit 594 and the voltage dividing unit 630 generating four divided voltages using five resistors R1, R2, R3, R4 and R5, a larger number of divided voltages can be generated with the same number of resistors, even though the number of the control signals must be adjusted. Likewise, the same number of divided voltages can be generated using a smaller number of resistors. In this way, a variety of divided voltages can be generated, while a burden on a chip area is reduced. Consequently, the semiconductor device can be efficiently laid out.

In accordance with the present invention, the voltage level of the control voltage (V_CTR) terminal can be rapidly increased up to the start-up level through the start-up operation prior to the operation of the VCO 550. Therefore, the PLL can ensure a fast locking time.

The start-up driver 590 may further include a PLL enable signal generating unit 710 for enabling the PLL after the start-up operation.

Figure 7:
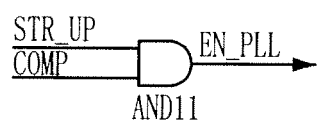
FIG. 7 is a circuit diagram of a PLL enable signal generating unit.

FIG. 7 is a circuit diagram of the PLL enable signal generating unit 710.

Referring to FIG. 7, the PLL enable signal generating unit 710 may include a first AND gate AND11 configured to receive the start-up signal STR_UP and the comparison signal COMP to generate the PLL enable signal EN_PLL.

The PLL enable signal EN_PLL is activated after the voltage level of the control voltage (V_CTR) terminal increases up to the start-up level through the start-up operation. The PLL enable signal EN_PLL is activated to a logic high level in response to the start-up signal STR_UP, which becomes a logic high level in the start-up operation, and the comparison signal COMP, which becomes a logic high level when the voltage level of the control voltage (V_CTR) terminal increases above the start-up level.

Figure 8:
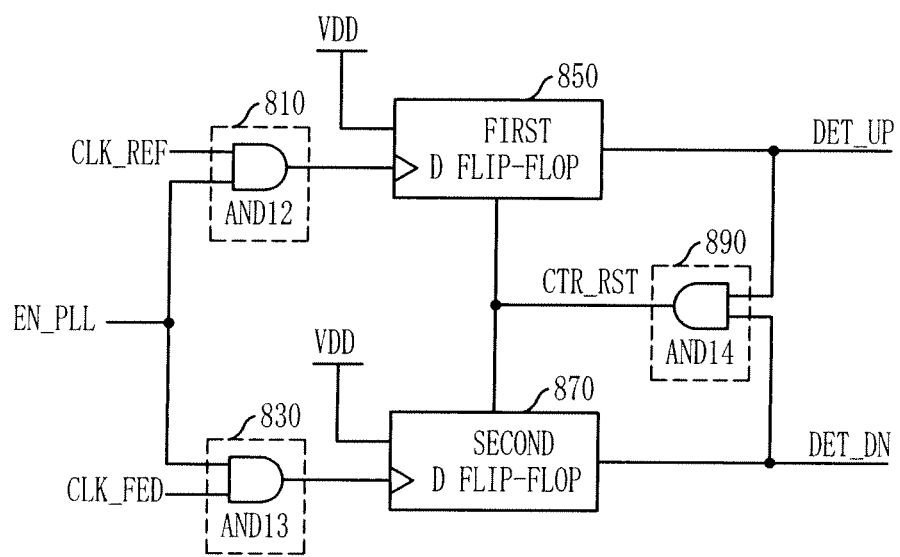
FIG. 8 is a circuit diagram of a phase detector illustrated in FIG. 4.

FIG. 8 is a circuit diagram of the phase detector 510 illustrated in FIG. 4.

Referring to FIG. 8, the phase detector 510 includes a first output unit 810, a second output unit 830, a first D flip-flop 850, a second D flip-flop 870, and a resetting unit 890. The first output unit 810 outputs the reference clock CLK_REF in response to the PLL enable signal EN_PLL. The second output unit 830 outputs the feedback clock CLK_FED in response to the PLL enable signal EN_PLL. The first D flip-flop 850 outputs the up detection signal DET_UP in response to an output clock of the first output unit 810. The second D flip-flop 870 outputs the down detection signal DET_DN in response to an output clock of the second output unit 830. The resetting unit 890 generates the reset signal CTR_RST for resetting the first and second D flip-flops 850 and 870 in response to the up detection signal DET_UP and the down detection signal DET_DN.

The first output unit 810 may include a second AND gate AND12 configured to receive the PLL enable signal EN_PLL and the reference clock CLK_REF, and the second output unit 830 may include a third AND gate AND13 configured to receive the PLL enable signal EN_PLL and the feedback CLK_FED. The resetting unit 890 may include a fourth AND gate AND14 configured to receive the up detection signal DET_UP and the down detection signal DET_DN. Since circuit configurations of the first and second D flip-flops 850 and 870 are well known, their detailed description will be omitted.

The first D flip-flop 850 of the phase detector 510 receives the reference clock CLK_REF in response to the PLL enable signal EN_PLL, and the second D flip-flop 870 receives the feedback clock CLK_FED in response to the PLL enable signal EN_PLL. Consequently, the phase detector 510 operates after the control voltage V_CTR increases up to the start-up level.

As described above, the locking time of the PLL can be significantly reduced by providing the start-up level, which is a voltage level enabling the generation of the internal voltage CLK_INN having a desired frequency, to the control voltage (V_CTR) terminal prior to the activation of the VCO 550.

Due to the reduced locking time, the power consumption in the locking operation can be reduced. While the conventional PLL increases the control voltage V_CTR up to the desired level only through the oscillating operation of the VCO, the PLL in accordance with the embodiment of the present invention increase the control voltage V_CTR up to the desired level through the pull-up operation, thereby reducing the power consumption.

Although the PMOS transistor PM1 is used as the pull-up driving unit 598B in the above-described embodiment, other types of transistors can also be used. Further, the positions and types of the logic gates and transistors may be modified according to logic levels of the input signals.

Although the start-up operation of the PLL has been exemplarily described, the present invention can also be applied to start-up operations of the DLL and other circuits.

A fast circuit operation characteristic can be obtained by reducing the locking time necessary to generate the internal clock having the desired frequency. Furthermore, the power consumed in the locking operation can be efficiently used.

While the present invention has been described with respect to the specific embodiments, it will be apparent to those skilled in the art that various changes and modifications may be made without departing from the spirit and scope of the invention as defined in the following claims.

What is claimed is:

1. A phase locked loop, comprising:
   a phase detector configured to detect a phase difference between a reference clock and a feedback clock to generate a detection signal corresponding to the detected phase difference;
   a control voltage generator configured to generate a control voltage having a voltage level corresponding to the detection signal;
   a voltage controlled oscillator configured to generate an internal clock having a frequency corresponding to a voltage level of the control voltage; and
   a start-up driver coupled to said phase detector and said control voltage generator, said start-up driver configured to receive a start-up signal from an external source, and at least one start-up level multiplex signal having said reference clock information, and, in response to the start-up signal, to drive a control voltage terminal to a predefined start-up level corresponding to the start-up level multiplex signal prior to providing an enable signal to said phase detector, wherein the start-up driver comprises:
a voltage generating unit configured to divide a source voltage into a plurality of divided voltages;
a voltage selecting unit configured to select one of the plurality of divided voltages in response to the at least one start-up level multiplex signal;
a voltage comparing unit configured to compare a voltage level of the control voltage terminal with a voltage level of the selected divided voltage to generate a comparison signal; and
a driving unit configured to drive the control voltage terminal by pulling up the control voltage terminal in response to the comparison signal and the start-up signal.

2. The phase locked loop as recited in claim 1, wherein the start-up level has different voltage levels according to the at least one start-up level multiplex signal.

3. The phase locked loop as recited in claim 1, wherein the voltage generating unit includes:
an enable signal generating unit configured to receive the start-up signal and the comparison signal to generate an enable signal;
an enabling unit configured to be enabled in response to the enable signal; and
a voltage dividing unit connected between a source voltage terminal and the enabling unit to divide the source voltage,
wherein the enable signal is activated in response to the start-up signal and deactivated in response to the comparison signal.

4. The phase locked loop as recited in claim 3, wherein the voltage dividing unit includes a plurality of resistors serially connected between the source voltage terminal and the enabling unit.

5. The phase locked loop as recited in claim 3, wherein the voltage generating unit further includes a multiplexing unit configured to receive a plurality of output voltages of the voltage dividing unit and select one of the respective output voltages and a voltage having a mid voltage level thereof based on at least one control signal.

6. The phase locked loop as recited in claim 5, wherein the multiplexing unit includes:
a first switching unit configured to connect a first output voltage terminal of the voltage dividing unit to a first output voltage terminal of the multiplexing unit in response to the first control signal; and
a second switching unit configured to connect a second output voltage terminal of the voltage dividing unit to the first output voltage terminal of the multiplexing unit in response to the second control signal.

7. The phase locked loop as recited in claim 1, wherein the driving unit includes:
a driving control signal generating unit configured to receive the start-up signal and the comparison signal to generate a driving control signal; and
a pull-up driving unit configured to pull up the control voltage terminal in response to the driving control signal,
wherein the driving control signal is activated in response to the start-up signal and deactivated in response to the comparison signal.

8. The phase locked loop as recited in claim 1, wherein the comparison signal is activated when a voltage level of the control voltage terminal is higher than that of the selected divided voltage, and is deactivated when the voltage level of the control voltage terminal is lower than that of the selected divided voltage.

9. The phase locked loop as recited in claim 1, further including a PLL enable signal generator configured to generate a PLL enable signal for enabling the phase locked loop in response to the start-up signal and the comparison signal,
wherein the PLL enable signal is activated after the control voltage terminal reaches the predefined start-up level.

10. The phase locked loop as recited in claim 9, wherein the phase detector generates a first detection signal and a second detection signal in response to the PLL enable signal.

11. The phase locked loop as recited in claim 10, wherein the first detection signal is activated when a phase of the feedback clock lags behind that of the reference clock.

12. The phase locked loop as recited in claim 10, wherein the second detection signal is activated when a phase of the feedback clock leads that of the reference clock.

13. The phase locked loop as recited in claim 10, wherein the phase detector includes:
a first output unit configured to output the reference clock in response to the PLL enable signal;
a second output unit configured to output the feedback clock in response to the PLL enable signal;
a first detection signal generating unit configured to generate the first detection signal in response to an output clock of the first output unit;
a second detection signal generating unit configured to generate the second detection signal in response to an output clock of the second output unit; and
a resetting unit configured to reset the first detection signal generating unit and the second detection signal generating unit in response to the first detection signal and the second detection signal.

14. A method for operating a phase locked loop having a voltage controlled oscillator for generating an internal clock having a frequency corresponding to a voltage level of a control voltage, the method comprising:
receiving a start-up signal from an external source and a start-up level multiplex signal having reference clock information;
dividing a source voltage into a plurality of divided voltages;
selecting one of the plurality of divided voltages in response to the at least one start-up level multiplex signal;
comparing a voltage level of a control voltage terminal with a voltage level of the selected divided voltage to generate a comparison signal;
driving the control voltage terminal by pulling up the control voltage terminal in response to the comparison signal and the start-up signal activated; and
after said driving, performing a locking operation of the phase locked loop.

15. The method as recited in claim 14, wherein the start-up level is selected according to the at least one start-up level multiplex signal.

16. The method as recited in claim 14, wherein the generating of the plurality of divided voltages includes:
receiving the start-up signal and the comparison signal to generate an enable signal; and
dividing the source voltage in response to the enable signal.

17. The method as recited in claim 16, wherein the generating of the plurality of divided voltages further includes selecting one of the respective output voltages and a voltage having a mid voltage level thereof.

18. The method as recited in claim 14, wherein the driving of the control voltage includes:
receiving the start-up signal and the comparison signal to generate a driving control signal; and
pulling up the control voltage in response to the driving control signal.

19. The method as recited in claim 14, wherein the comparison signal is activated when a voltage level of the control voltage terminal is higher than that of the selected divided voltage, and is deactivated when the voltage level of the control voltage terminal is lower than that of the selected divided voltage.

20. The method as recited in claim 14, further including generating a PLL enable signal for enabling the phase locked loop in response to the start-up signal and the comparison signal, the PLL enable signal activated after the control voltage terminal reaches the predefined start-up level.

21. The method as recited in claim 20, wherein the performing of the locking operation includes:
detecting a phase difference between a reference clock and a feedback clock corresponding to the internal clock to generate a detection signal corresponding to the detected phase difference in response to the PLL enable signal;
generating the control voltage having a voltage level corresponding to the detection signal; and
generating the internal clock having a frequency corresponding to the control voltage.

22. An integrated circuit, comprising:
a phase locked loop including a voltage controlled oscillator; and
a start-up driver coupled to said voltage controlled oscillator and configured to receive a start-up signal from an external source, and a start-up level multiplex signal- and to drive a control voltage terminal coupled to said voltage controlled oscillator and to a voltage level corresponding to a target frequency corresponding to the start-up level multiplex sensor before the operation of the phase-locked loop is enabled by said start-up driver,
wherein the start-up driver comprises:
a voltage generating unit configured to divide a source voltage into a plurality of divided voltages;
a voltage selecting unit configured to select one of the plurality of divided voltages in response to the at least one start-up level multiplex signal;
a voltage comparing unit configured to compare a voltage level of the control voltage terminal with a voltage level of the selected divided voltage to generate a comparison signal; and
a driving unit configured to drive the control voltage terminal by pulling up the control voltage terminal in response to the comparison signal and the start-up signal.

23. The integrated circuit as recited in claim 22, wherein the target frequency corresponds to a frequency of a signal outputted after a locking of the phase locked loop.

\* \* \* \* \*